United States Patent [19]

Hirai et al.

[11] Patent Number: 4,830,996
[45] Date of Patent: May 16, 1989

[54] FERROELECTRIC CERAMICS

[75] Inventors: Nobuki Hirai, Kimitsu; Yoshihisa Ushida; Takao Ohno, both of Ichihara, all of Japan

[73] Assignee: Mitsui Petrochemical Industries, Ltd., Tokyo, Japan

[21] Appl. No.: 218,550

[22] Filed: Jul. 13, 1988

[30] Foreign Application Priority Data

Jul. 14, 1987 [JP] Japan .................................. 62-176656

[51] Int. Cl.$^4$ ............................................. G04B 35/49
[52] U.S. Cl. .................................... 501/136; 501/135; 252/62.9
[58] Field of Search ....................... 501/135, 136, 152; 252/62.9

[56] References Cited

U.S. PATENT DOCUMENTS 3,956,150  5/1976  Duchi et al. ...................... 252/62.9
4,716,134 12/1987  Yamaguchi et al. ............ 501/135 X

FOREIGN PATENT DOCUMENTS 0004275 10/1974  Japan .................................... 501/152
1219983  1/1971  United Kingdom ............... 252/62.9

*Primary Examiner*—William R. Dixon, Jr.
*Assistant Examiner*—Karl Group
*Attorney, Agent, or Firm*—Sherman & Shalloway

[57] ABSTRACT

Ferroelectric ceramics represented by $xPbTiO_3$-$yPbZrO_3$-$zPb(Mg_{\frac{1}{3}}Nb_{\frac{2}{3}})O_3$-$mSrTiO_3$-$nSnO_2$-$pZnO$-$qBi_2O_3$-$rX$ wherein x,y,z,m,n,p,q and r represent amounts by mole, respectively, with the proviso that x+y+z being 1, Z is at least one oxide selected from the group consisting of $Dy_2O_3$, $Ta_2O_5$, and $Y_2O_3$, and wherein x is from 0.25 to 0.50, y is from 0.05 to 0.70, z is from 0.05 to 0.70, m is from 0 to 0.10, n is from 0 to 0.04, p is from 0 to 0.04, q is from 0 to 0.02 and r is from 0.005 to 0.02. The disclosed ferroelectric ceramics have increased relative dielectric constant and/or electromechanical coupling factor, and are suitable for use as actuators.

8 Claims, No Drawings

FERROELECTRIC CERAMICS

FIELD OF THE INVENTION

The present invention relates to ferroelectric ceramics of $PbTiO_3$—$PbZrO_3$—$Pb(Mg_{\frac{1}{3}}Nb_{\frac{2}{3}})O_3$ series. More particularly, it relates to ferroelectric ceramics of $PbTiO_3$—$PbZrO_3$—$Pb(Mg_{\frac{1}{3}}Nb_{\frac{2}{3}})O_3$ series having increased relative dielectric constant and/or electromechanical coupling factor.

BACKGROUND OF THE INVENTION

Piezoelectric materials comprising ferroelectric ceramics have heretofore been used in ceramic filters, mechanical filters, ultrasonic transducer and piezoelectric buzzers. When piezoelectric materials are used in such applications, resonance characteristics of the materials are utilized, and in this respect ferroelectric ceramics of $PbTiO_3$—$PbZrO_3$ series optionally having $BaTiO_3$, $SrTiO_3$ and/or $CaTiO_3$ added thereto have been generally used. Recently, to improved various characteristics of the ferroelectric ceramics of $PbTiO_3$—$PbZrO_3$ series, ternary piezoelectric ceramics represented by $PbTiO_3$—$PbZrO_3$—$Pb(Mg_{\frac{1}{3}}Nb_{\frac{2}{3}})O_3$ have also been proposed.

On the other hand, use of piezoelectric in the non-resonance state, for example use of piezoelectric ceramics as an actuator, has also been studied. However, when a piezoelectric ceramic material is used in the non-resonance state, it is necessary to transform electric energy to mechanical energy which displaces the piezoelectric ceramics material itself. Accordingly, piezoelectric ceramics having a large piezoelectric strain constant d are required.

Among the piezoelectric strain constant d, electromechanical coupling factor k and relative dielectric constant $\epsilon$, of a piezoelectric ceramic material, there is a following relation:

$$d \propto k \sqrt{\epsilon}$$

and therefore, in order that the material has a large piezoelectric strain constant d, it must has a large electromechanical coupling factor k and/or a large relative dielectric constant.

It is known in the art that piezoelectric ceramics of $PbTiO_3$—$PbZrO_3$—$Pb(Mg_{\frac{1}{3}}Nb_{\frac{2}{3}})O_3$—$SrTiO_3$ series have a large relative dielectric constant and a large electromechanical coupling factor.

OBJECT OF THE INVENTION

An object of the invention is to provide novel ferroelectric ceramics of $PbTiO_3$—$PbZrO_3$—$Pb(Mg_{\frac{1}{3}}Nb_{\frac{2}{3}})O_3$ series which have further increased relative dielectric constant and/or electromechanical coupling factor and thus can be used as an actuator.

SUMMARY OF THE INVENTION

In has now been found that the relative dielectric constant and/or electromechanical coupling factor of piezoelectric ceramics of $PbTiO_3$—$PbZrO_3$—$Pb(Mg_{\frac{1}{3}}Nb_{\frac{2}{3}})O_3$—$SrTiO_3$ series optionally having added thereto $SrTiO_3$, $SnO_2$, $ZnO$ or $Bi_2O_3$ can be further increased by incorporation of a specified amount of at least one oxide selected from the group consisting of $Dy_2O_3$, $Ta_2O_5$, and $Y_2O_3$.

Thus, ferroelectric ceramics according to the invention are represented by $xPbTiO_3$—$yPbZrO_3$—$zPb(Mg_{\frac{1}{3}}Nb_{\frac{2}{3}})O_3$—$mSrTiO_3$—$nSnO_2$—$pZnO$—$qBi_2O_3$—$rX$ wherein x, y, z, m, n, p, q and r represent amounts by mole, respectively, with the proviso that $x+y+z$ being 1, X is at least one oxide selected from the group consisting of $Dy_2O_3$, $Ta_2O_5$, and $Y_2O_3$, x is from 0.25 to 0.50, y is from 0.05 to 0.70, z is from 0.05 to 0.70, m is from 0 to 0.10, n is from 0 to 0.04, p is from 0 to 0.04, q is from 0 to 0.02 and r is from 0.005 to 0.02.

DETAILED DESCRIPTION OF THE INVENTION

The ferroelectric ceramics according to the invention will now be described in detail.

The ferroelectric ceramics according to the invention are represented by: $xPbTiO_3$—$yPbZrO_3$—$zPb(Mg_{\frac{1}{3}}Nb_{\frac{2}{3}})O_3$—$mSrTiO_3$—$nSnO_2$—$pZnO$—$qBi_2O_3$—$rX$ where x, y, z, m, n, p, q and r represent amounts by mole, respectively, with the proviso that $x+y+z$ being 1, X is at least one oxide selected from the group consisting of $Dy_2O_3$, $Ta_2O_5$, $Y_2O_3$, and wherein:

x is from 0.25 to 0.50, preferably from 0.30 to 0.45,
y is from 0.05 to 0.70, preferably from 0.10 to 0.60,
z is from 0.05 to 0.70, preferably from 0.10 to 0.60,
m is from 0 to 0.10, preferably from 0.05 to 0.10,
n is from 0 to 0.04, preferably from 0.01 to 0.02,
p is from 0 to 0.04, preferably from 0.01 to 0.02,
q is from 0 to 0.02, preferably from 0.01 to 0.02, and
r is from 0.005 to 0.02, preferably from 0.008 to 0.02.

As defined above, according to the invention, a specified amount of at least one oxide selected from the group consisting of $Dy_2O_3$, $Ta_2O_5$ and $Y_2O_3$, is added to ferroelectric ceramics of $xPbTiO_3$—$yPbZrO_3$—$zPb(Mg_{\frac{1}{3}}Nb_{\frac{2}{3}})O_3$ series which optionally contain a specified amount of $SrTiO_3$, $SnO_2$, $ZnO$ or $Bi_2O_3$.

It has found that the piezoelectric strain constant, namely the relative dielectric constant and/or electromechanical coupling factor, of piezoelectric ceramics of $PbTiO_3$—$PbZrO_3$—$Pb(Mg_{\frac{1}{3}}Nb_{\frac{2}{3}})O_3$ series optionally having added thereto $SrTiO_3$, $SnO_2$, $ZnO$ or $Bi_2O_3$ can be remarkably increased by adding thereto from 0.005 to 0.02 mole, preferably from 0.008 to 0.02 mole of at least one oxide selected from the group consisting of $Dy_2O_3$, $Ta_2O_5$, and $Y_2O_3$. With substantially less than 0.005 mole of $Dy_2O_3$, $Ta_2O_5$, and or $Y_2O_3$, the relative dielectric constant of the product is not appreciably improved. Where as addition of an excess amount of $Dy_2O_3$, $Ta_2O_5$ or $Y_2O_3$, must be avoided. In fact, as the amount of $Dy_2O_3$, $Ta_2O_5$ and/or $Y_2O_3$ added exceeds 0.20 mole, the electromechanical coupling factor tends to be reduced instead.

Further, ceramic compositions of the formula: $xPbTiO_3$—$yPbZrO_3$—$zPb(Mg_{\frac{1}{3}}Nb_{\frac{2}{3}})O_3$—$mSrTiO_3$—$nSnO_2$—$pZnO$—$qBi_2O_3$—$rX$ wherein x is less than 0.25 or more than 0.50, y is less than 0.05 or more than 0.70, or z is less than 0.05 or more than 0.70, are not preferably, since they do not have appreciably increased relative dielectric constant and/or electromechanical coupling factor. Ceramic compositions of the above formula wherein m is more than 0.10 are also not preferably, since they have a reduced electromechanical coupling factor. Further, it has been found that as n exceeds 0.04, p exceeds 0.04 or q exceeds 0.02, both the relative dielectric constant and electromechanical coupling factor of the material tend to be reduced.

The ferroelectric ceramics according to the invention are prepared by weighing suitable amounts of suitable starting compounds selected from;
PbO(lead monoxide),
$ZrO_2$(zirconium oxide),
$TiO_2$(titanium oxide),
$MgCO_3$(magnesium carbonate),
$Nb_2O_5$(niobium oxide),
$SrCO_3$(strontium carbonate),
$SnO_2$(stannic oxide),
ZnO(zinc oxide),
$Bi_2O_3$(bismuth oxide),
$Dy_2O_3$(dysprosium oxide),
$Ta_2O_5$(tantalum oxide), and
$Y_2O_3$(yttrium oxide),
to provide a suitable staring mixture containing required metallic elements in required molar proportions depending upon the particular desired product, and calcining the mixture at a temperature from about 1000° to about 1300° C.

More particularly, the ferroelectric ceramics according to the invention can be prepared by the following processes.

A suitable starting mixture containing required metallic elements in required molar proportions depending upon the particular desired product is pulverized in a ball mill and precalcined at a temperature of from about 900° to 1100° C. for a period of from 2 to 6 hours to provide a precalcined product.

The precalcined product is again subjected to a ball mill treatment, admixed with a binder such as polyvinyl alcohol in an amount of from 1 to 20% by weight based on the resulting admixture, dried e.g. by means of a spray drier, and press formed under a pressure of from 500 to 1500 kg/cm² and subjected to a further calcination in air at a temperature ranging from about 1000° to about 1300° C., using a crucible made of a refractory material such as MgO which is highly heat resistant and hardly absorb metallic elements such as Pb. During the further calcination, Pb is liable to be volatilized thereby frequently resulting in a product containing Pb in an amount less than that required. To avoid this, the further calcination is preferably carried out in a Pb rich atmosphere which can be established simply by placing particulate $PbTiO_3$ in the vicinity of the crucible.

By the process as illustrated above the dense ferroelectric ceramics according to the invention can be prepared.

EFFECT OF THE INVENTION

The ferroelectric ceramics according to the invention which comprise a ferroelectric ceramic material of $XPbTiO_3$—$yPbZrO_3$—$zPb(Mg_{\frac{1}{3}}Nb_{\frac{2}{3}})O_3$ series (optionally containing a specified amount of $SrTiO_3$, $SnO_2$, ZnO or $Bi_2O_3$) having added thereto a specified amount of at least one oxide selected from the group consisting of $Dy_2O_3$, $Ta_2O_5$, and $Y_2O_3$., have an increased piezoelectric strain constant that is an increased electromechanical coupling coefficient and/or an increased relative dielectric constant, and therefore can be used as actuators.

While the invention will be further described by the following examples, the invention is not restricted thereto.

EXAMPLE 1

Suitable amounts of PbO, $ZrO_2$, $TiO_2$, $MgCO_3$, $Nb_2O_5$, $SrCO_3$, $SnO_2$, ZnO, $Bi_2O_3$ and $Dy_2O_3$ were weighted to provide starting compounds capable of producing ferroelectric ceramics having compositions indicated in Table 1.

Each compound was processed in a ball mill for a period of about 24 hours. The mixture was removed from the mill, dried, passed through a 60 mesh sieve, press formed under a pressure of 500 kg/cm² and precalcined at a temperature of 1000° C.

The precalcined product was then passed through a 40 mesh sieve, and again ball milled for a period of 24 hours. The content of the mill was taken out, admixed with 2% by weight of polyvinyl alcohol based on the weight of the resulting admixture, and dried by means of a spray drier to provide particles, which were then press formed under a pressure of about 1000 kg/cm² to a disc having a diameter of 25 mm and a thickness of about 2 mm. The disc was placed in a crucible made of MgO. The crucible was covered with a well sealing lid, and particulate $PbTiO_3$ was placing in the vicinity of the crucible. The disc in the crucible was then calcined in air at temperatures of from 1210° to 1270° C. for a period of about 2 hours to provide a dense calcined disc having a density of not less than 7.7 g/cm³.

The surfaces of the disc thus obtained were polished with particulate diamond having a diameter of 6 μm to provide a specimen, which was tested for various electric properties as described below.

After the specimen thus obtained was coated with a silver paste on both surfaces and baked at a temperature of 750° C., it was polarized by application of an electric field of 40 KV/cm at a temperature of about 100° C. and aged for 12 hours at a temperature of 50° C. On the so treated specimen the relative dielectric constant ($\epsilon$) and the dielectric loss (tan δ) were measured at a frequency of 10 KHz, by means of an impedance analyzer. Separately, the resonance frequency (Fr) and the antiresonance frequency (Fa) of the disc specimen were measured. The radial electromechanical coupling factor (kp) of the specimen was determined from the following equation:

$$\frac{1}{kp^2} = a \frac{Fr}{Fa - Fr} + b$$

wherein a is 0.395 and b is 0.574.

Further, the piezoelectric constant ($d_{31}$) of the specimen was calculated from the following equation:

$$d_{31} = \sqrt{\frac{1-\sigma}{2}} \, kp \sqrt{\epsilon_{33}^T \cdot S_{11}^E} \; (\times 10^{-12} m/v)$$

wherein the Poisson's ratio ($\sigma$) and the elastic compliance ($S_{11}^E$) were determined from the resonance characteristics of the specimen.

Table 1 shows the relative dielectric constant ($\epsilon$), dielectric loss (tan δ), radial electric mechanical coupling factor (kp) and piezoelectric constant ($d_{31}$) of the ferroelectric ceramics represented by $xPbTiO_3$—$yPbZrO_3$—$zPb(Mg_{\frac{1}{3}}Nb_{\frac{2}{3}})O_3$—$mSrTiO_3$—$nSnO_2$—$pZnO$—$qBi_2O_3$—$rDy_2O_3$ with various of values x, y, z, m, n, p, q and r indicated in the same table.

Table 1 reveals that the relative dielectric constant ($\epsilon$), dielectric loss (tan δ), radial electric mechanical coupling factor (kp) and piezoelectric constant ($d_{31}$) of the ferroelectric ceramics of $xPbTiO_3$—$yPb$-

$ZrO_3$—$zPb(Mg_{\frac{1}{3}}Nb_{\frac{2}{3}})O_3$—$mSrTiO_3$—$nSnO_2$—$pZnO$—$qBi_2O_3$ series are enlarged by addition of $Dy_2O_3$.

TABLE 1

| Composition (mole) | | | | | | | | Electric Properties | | | |
|---|---|---|---|---|---|---|---|---|---|---|---|
| x | y | z | m | n | p | q | r | ε | tan δ | kp | $d_{31}$ |
| 0.34 | 0.26 | 0.40 | 0.05 | 0.02 | 0.02 | 0.01 | 0 | 4200 | 0.025 | 0.58 | 265 |
| 0.34 | 0.26 | 0.40 | 0.05 | 0.02 | 0.02 | 0.01 | 0.005 | 4500 | 0.024 | 0.58 | 273 |
| 0.34 | 0.26 | 0.40 | 0.05 | 0.02 | 0.02 | 0.01 | 0.01 | 5000 | 0.025 | 0.62 | 302 |
| 0.34 | 0.26 | 0.40 | 0.05 | 0.02 | 0.02 | 0.01 | 0.02 | 5800 | 0.030 | 0.60 | 313 |
| 0.34 | 0.26 | 0.40 | 0.10 | 0.02 | 0.02 | 0.01 | 0 | 4500 | 0.032 | 0.47 | 213 |
| 0.34 | 0.26 | 0.40 | 0.10 | 0.02 | 0.02 | 0.01 | 0.02 | 5000 | 0.035 | 0.50 | 252 |
| 0.34 | 0.26 | 0.40 | 0.05 | 0.01 | 0.01 | 0.02 | 0 | 3500 | 0.023 | 0.55 | 226 |
| 0.34 | 0.26 | 0.40 | 0.05 | 0.01 | 0.01 | 0.02 | 0.02 | 5000 | 0.021 | 0.60 | 294 |
| 0.34 | 0.26 | 0.40 | 0.05 | 0 | 0 | 0 | 0 | 2900 | 0.030 | 0.40 | 155 |
| 0.34 | 0.26 | 0.40 | 0.05 | 0 | 0 | 0 | 0.01 | 4200 | 0.032 | 0.49 | 231 |
| 0.34 | 0.26 | 0.40 | 0.05 | 0 | 0 | 0 | 0.02 | 4400 | 0.034 | 0.48 | 228 |
| 0.41 | 0.34 | 0.25 | 0.05 | 0.02 | 0.02 | 0.01 | 0 | 4000 | 0.030 | 0.55 | 239 |
| 0.41 | 0.34 | 0.25 | 0.05 | 0.02 | 0.02 | 0.01 | 0.02 | 5500 | 0.025 | 0.61 | 302 |
| 0.38 | 0.50 | 0.12 | 0.05 | 0.02 | 0.02 | 0.01 | 0 | 4000 | 0.028 | 0.54 | 235 |
| 0.38 | 0.50 | 0.12 | 0.05 | 0.02 | 0.02 | 0.01 | 0.02 | 5000 | 0.025 | 0.62 | 300 |
| 0.30 | 0.12 | 0.58 | 0.05 | 0.02 | 0.02 | 0.01 | 0 | 3000 | 0.028 | 0.45 | 174 |
| 0.30 | 0.12 | 0.58 | 0.05 | 0.02 | 0.02 | 0.01 | 0.02 | 4000 | 0.028 | 0.50 | 222 |

Composition: $xPbTiO_3 + yPbZrO_3 + zPb(Mg_{\frac{1}{3}}Nb_{\frac{2}{3}})O_3 + mSrTiO_3 + nSnO_2 + pZnO + qBi_2O_3 + rDy_2O_3$ with the proviso of $x + y + z = 1$ $ZrO_3$—$zPb(Mg_{\frac{1}{3}}Nb_{\frac{2}{3}})O_3$—$mSrTiO_3$—$nSnO_2$—$pZnO$—$qBi_2O_3$ series are enlarged by addition of $Ta_2O_5$.

TABLE 2

| Composition (mole) | | | | | | | | Electric Properties | | | |
|---|---|---|---|---|---|---|---|---|---|---|---|
| x | y | z | m | n | p | q | r | ε | tan δ | kp | $d_{31}$ |
| 0.34 | 0.26 | 0.40 | 0.05 | 0.02 | 0.02 | 0.01 | 0 | 4200 | 0.025 | 0.58 | 265 |
| 0.34 | 0.26 | 0.40 | 0.05 | 0.02 | 0.02 | 0.01 | 0.005 | 4400 | 0.025 | 0.58 | 275 |
| 0.34 | 0.26 | 0.40 | 0.05 | 0.02 | 0.02 | 0.01 | 0.01 | 4900 | 0.027 | 0.61 | 299 |
| 0.34 | 0.26 | 0.40 | 0.05 | 0.02 | 0.02 | 0.01 | 0.02 | 5800 | 0.033 | 0.59 | 309 |
| 0.34 | 0.26 | 0.40 | 0.10 | 0.02 | 0.02 | 0.01 | 0 | 4500 | 0.032 | 0.47 | 213 |
| 0.34 | 0.26 | 0.40 | 0.10 | 0.02 | 0.02 | 0.01 | 0.02 | 5200 | 0.039 | 0.48 | 244 |
| 0.34 | 0.26 | 0.40 | 0.05 | 0.01 | 0.01 | 0.02 | 0 | 3500 | 0.023 | 0.55 | 226 |
| 0.34 | 0.26 | 0.40 | 0.05 | 0.01 | 0.01 | 0.02 | 0.02 | 4800 | 0.023 | 0.59 | 290 |
| 0.34 | 0.26 | 0.40 | 0.05 | 0 | 0.02 | 0.01 | 0 | 4000 | 0.023 | 0.58 | 250 |
| 0.34 | 0.26 | 0.40 | 0.05 | 0 | 0.02 | 0.01 | 0.008 | 5500 | 0.029 | 0.60 | 313 |
| 0.34 | 0.26 | 0.40 | 0.05 | 0.01 | 0 | 0.01 | 0 | 3800 | 0.025 | 0.59 | 253 |
| 0.34 | 0.26 | 0.40 | 0.05 | 0.01 | 0 | 0.01 | 0.008 | 5700 | 0.030 | 0.61 | 320 |
| 0.41 | 0.34 | 0.25 | 0.05 | 0.02 | 0.02 | 0.01 | 0 | 4000 | 0.030 | 0.55 | 239 |
| 0.41 | 0.34 | 0.25 | 0.05 | 0.02 | 0.02 | 0.01 | 0.02 | 5300 | 0.025 | 0.61 | 308 |
| 0.38 | 0.50 | 0.12 | 0.05 | 0.02 | 0.02 | 0.01 | 0 | 4000 | 0.028 | 0.54 | 235 |
| 0.38 | 0.50 | 0.12 | 0.05 | 0.02 | 0.02 | 0.01 | 0.02 | 5100 | 0.030 | 0.62 | 297 |
| 0.30 | 0.12 | 0.58 | 0.05 | 0.02 | 0.02 | 0.01 | 0 | 3000 | 0.028 | 0.45 | 174 |
| 0.30 | 0.12 | 0.58 | 0.05 | 0.02 | 0.02 | 0.01 | 0.02 | 3900 | 0.027 | 0.50 | 221 |

Composition: $xPbTiO_3 + yPbZrO_3 + zPb(Mg_{\frac{1}{3}}Nb_{\frac{2}{3}})O_3 + mSrTiO_3 + nSnO_2 + pZnO + qBi_2O_3 + rTa_2O_5$ with the proviso of $x + y + z = 1$

EXAMPLE 2

Ferroelectric ceramics represented by $xPbTiO_3$—$yPbZrO_3$—$zPb(Mg_{\frac{1}{3}}Nb_{\frac{2}{3}})O_3$—$mSrTiO_3$—$nSnO_2$—$pZnO$—$qBi_2O_3$—$rTa_2O_5$ were prepared by the procedures described in Example 1 except that the indicated amounts of $Ta_2O_5$ were used instead of the $Dy_2O_3$, and tested for various electric properties as in Example 1.

The results are shown in Table 2.

Table 2 reveals that the relative dielectric constant (ε), dielectric loss (tan δ), radial electric mechanical coupling factor (kp) and piezoelectric constant ($d_{31}$) of the ferroelectric ceramics of $xPbTiO_3$—$yPb$-

EXAMPLE 3

Ferroelectric ceramics represented by $xPbTiO_3$—$yPbZrO_3$—$zPb(Mg_{\frac{1}{3}}Nb_{\frac{2}{3}})O_3$—$mSrTiO_3$—$nSnO_2$—$pZnO$—$qBi_2O_3$—$rY_2O_3$ were prepared by the procedures described in Example 1 except that the indicated amounts of $Y_2O_3$ were used instead of the $Dy_2O_3$, and tested for various electric properties as in Example 1.

The results are shown in Table 3.

Table 3 reveals that the relative dielectric constant (ε), dielectric loss (tan δ), radial electric mechanical coupling factor (kp) and piezoelectric constant ($d_{31}$) of ferroelectric ceramics of $xPbTiO_3$—$yPbZrO_3$—$zPb(Mg_{\frac{1}{3}}Nb_{\frac{2}{3}})O_3$—$mSrTiO_3$—$nSnO_2$—$pZnO$—$qBi_2O_3$ series are enlarged by addition of $Y_2O_3$.

TABLE 3

| Composition (mole) | | | | | | | | Electric Properties | | | |
|---|---|---|---|---|---|---|---|---|---|---|---|
| x | y | z | m | n | p | q | r | ε | tan δ | kp | $d_{31}$ |
| 0.34 | 0.26 | 0.40 | 0.05 | 0.02 | 0.02 | 0.01 | 0 | 4200 | 0.025 | 0.58 | 265 |
| 0.34 | 0.26 | 0.40 | 0.05 | 0.02 | 0.02 | 0.01 | 0.005 | 4300 | 0.025 | 0.58 | 271 |
| 0.34 | 0.26 | 0.40 | 0.05 | 0.02 | 0.02 | 0.01 | 0.01 | 4700 | 0.025 | 0.60 | 291 |
| 0.34 | 0.26 | 0.40 | 0.05 | 0.02 | 0.02 | 0.01 | 0.02 | 5500 | 0.030 | 0.58 | 298 |
| 0.34 | 0.26 | 0.40 | 0.10 | 0.02 | 0.02 | 0.01 | 0 | 4500 | 0.032 | 0.47 | 213 |

TABLE 3-continued

| \multicolumn{8}{c|}{Composition (mole)} | \multicolumn{4}{c}{Electric Properties} |
| x | y | z | m | n | p | q | r | $\epsilon$ | tan $\delta$ | kp | $d_{31}$ |
| --- | --- | --- | --- | --- | --- | --- | --- | --- | --- | --- | --- |
| 0.34 | 0.26 | 0.40 | 0.10 | 0.02 | 0.02 | 0.01 | 0.02 | 5000 | 0.040 | 0.47 | 238 |
| 0.34 | 0.26 | 0.40 | 0.05 | 0.01 | 0.01 | 0.02 | 0 | 3500 | 0.023 | 0.55 | 226 |
| 0.34 | 0.26 | 0.40 | 0.05 | 0.01 | 0.01 | 0.02 | 0.02 | 4500 | 0.024 | 0.58 | 273 |
| 0.41 | 0.34 | 0.25 | 0.05 | 0.02 | 0.02 | 0.01 | 0 | 4000 | 0.030 | 0.55 | 239 |
| 0.41 | 0.34 | 0.25 | 0.05 | 0.02 | 0.02 | 0.01 | 0.02 | 5000 | 0.027 | 0.58 | 287 |
| 0.38 | 0.50 | 0.12 | 0.05 | 0.02 | 0.02 | 0.01 | 0 | 4000 | 0.028 | 0.54 | 235 |
| 0.38 | 0.50 | 0.12 | 0.05 | 0.02 | 0.02 | 0.01 | 0.02 | 4800 | 0.025 | 0.58 | 284 |
| 0.30 | 0.12 | 0.58 | 0.05 | 0.02 | 0.02 | 0.01 | 0 | 3000 | 0.028 | 0.45 | 174 |
| 0.30 | 0.12 | 0.58 | 0.05 | 0.02 | 0.02 | 0.01 | 0.02 | 3700 | 0.027 | 0.49 | 212 |

Composition: $xPbTiO_3 + yPbZrO_3 + zPb(Mg_{\frac{1}{3}}Nb_{\frac{2}{3}})O_3 + mSrTiO_3 + nSnO_2 + pZnO + qBi_2O_3 + rY_2O_3$ with the proviso of $x + y + z = 1$

What is claimed is:

1. Ferroelectric ceramics represented by $xPbTiO_3$—$yPbZrO_3$—$zPb(Mg_{\frac{1}{3}}Nb_{\frac{2}{3}})O_3$—$mSrTiO_3$—$nSnO_2$—$pZnO$—$qBi_2O_3$—$rX$ wherein x, y, z, m, n, p, q and r represent amounts by mole, respectively, with the proviso that $x+y+z$ being 1, X is at least one oxide selected from the group consisting of $Dy_2O_3$, $Ta_2O_5$, and $Y_2O_3$, and wherein x is from 0.25 to 0.50, y is from 0.05 to 0.70, z is from 0.05 to 0.70, m is from 0 to 0.10, n is from 0 to 0.04, p is from 0 to 0.04, q is from 0 to 0.02 and r is from 0.005 to 0.02.

2. The ferroelectric ceramics according to claim 1 wherein x is from 0.30 to 0.45, y is from 0.10 to 0.60, z is from 0.10 to 0.60, m is from 0.05 to 0.10, n is from 0.01 to 0.02, p is from 0.01 to 0.02, q is from 0.01 to 0.02 and r is from 0.008 to 0.02.

3. Ferroelectric ceramics represented by $xPbTiO_3$—$yPbZrO_3$—$zPb(Mg_{\frac{1}{3}}Nb_{\frac{2}{3}})O_3$—$mSrTiO_3$—$nSnO_2$—$pZnO$—$qBi_2O_3$—$rDy_2O_3$ wherein x, y, z, m, n, p, q and r represent amounts by mole, respectively, with the proviso that $x+y+z$ being 1, and wherein x is from 0.25 to 0.50, y is from 0.05 to 0.70, z is from 0.05 to 0.70, m is from 0 to 0.10, n is from 0 to 0.04, p is from 0 to 0.04, q is from 0 to 0.02 and r is from 0.005 to 0.02.

4. The ferroelectric ceramics according to claim 3 wherein x is from 0.30 to 0.45, y is from 0.10 to 0.60, z is from 0.10 to 0.60, m is from 0.05 to 0.10, n is from 0.01 to 0.02, p is from 0.01 to 0.02, q is from 0.01 to 0.02 and r is from 0.008 to 0.02.

5. Ferroelectric ceramics represented by $xPbTiO_3$—$yPbZrO_3$—$zPb(Mg_{\frac{1}{3}}Nb_{\frac{2}{3}})O_3$—$mSrTiO_3$—$nSnO_2$—$pZnO$—$qBi_2O_3$—$rTa_2O_5$ wherein x, y, z, m, n, p, q and r represent amounts by mole, respectively, with the proviso that $x+y+z$ being 1, and wherein x is from 0.25 to 0.50, y is from 0.05 to 0.70, z is from 0.05 to 0.70, m is from 0 to 0.10, n is from 0 to 0.04, p is from 0 to 0.04, q is from 0 to 0.02 and r is from 0.005 to 0.02.

6. The ferroelectric ceramics according to claim 5 wherein x is from 0.30 to 0.45, y is from 0.10 to 0.60, z is from 0.10 to 0.60, m is from 0.05 to 0.10, n is from 0.01 to 0.02, p is from 0.01 to 0.02, q is from 0.01 to 0.02 and r is from 0.008 to 0.02.

7. Ferroelectric ceramics represented by $xPbTiO_3$—$yPbZrO_3$—$zPb(Mg_{\frac{1}{3}}Nb_{\frac{2}{3}})O_3$—$mSrTiO_3$—$nSnO_2$—$pZnO$—$qBi_2O_3$—$rY_2O_3$ wherein x, y, z, m, n, p, q and r represent amounts by mole, respectively, with the proviso that $x+y+z$ being 1, and wherein x is from 0.25 to 0.50, y is from 0.05 to 0.70, z is from 0.05 to 0.70, m is from 0 to 0.10, n is from 0 to 0.04, p is from 0 to 0.04, q is from 0 to 0.02 and r is from 0.005 to 0.02.

8. The ferroelectric ceramics according to claim 7 wherein x is from 0.30 to 0.45, y is from 0.10 to 0.60, z is from 0.10 to 0.60, m is from 0.05 to 0.10, n is from 0.01 to 0.02, p is from 0.01 to 0.02, q is from 0.01 to 0.02 and r is from 0.008 to 0.02.

* * * * *

UNITED STATES PATENT AND TRADEMARK OFFICE
CERTIFICATE OF CORRECTION

PATENT NO. : 4,830,996

DATED : May 16, 1989

INVENTOR(S) : NOBUKI HIRAI ET AL.

It is certified that error appears in the above-identified patent and that said Letters Patent is hereby corrected as shown below:

On the cover page of the patent, line 5 of the Abstract, "Z" should read --X--.

Signed and Sealed this

Ninth Day of January, 1990

Attest:

JEFFREY M. SAMUELS

Attesting Officer     Acting Commissioner of Patents and Trademarks